United States Patent Office 3,827,957

Patented Aug. 6, 1974

3,827,957

PHOTOPOLYMERIZABLE PIGMENTED VEHICLES CONTAINING CHLOROSULFONATED OR α-HALOALKYLATED POLYNUCLEAR KETONE INITIATORS

Vincent Daniel McGinniss, Middleburgh Heights, Ohio, assignor to SCM Corporation, Cleveland, Ohio No Drawing. Filed Jan. 12, 1973, Ser. No. 323,031
Int. Cl. C08d *1/00;* C08f *1/16*
U.S. Cl. 204—159.23 8 Claims

ABSTRACT OF THE DISCLOSURE

Photopolymerization of ethylenically unsaturated organic compounds utilizing photosensitive catalysts of the halogenated polynuclear ketone type is disclosed. Rapid polymerization or cure is observed even in the presence of organic and inorganic pigments.

BACKGROUND OF THE INVENTION

The present invention is concerned with photopolymerizable compositions and a process for producing the same by exposure to ultraviolet radiation in the presence of a photosenstive catalyst.

DESCRIPTION OF THE PRIOR ART

It is known that the photopolymerization of ethylenically unsaturated monomers can be initiated by exposure to various sources of radiation such as ultraviolet radiation. For example, methyl acrylate on long standing in sunlight will generally transform into a transparent mass. Use of sunlight or sources of comparable energy to photopolymerize monomers or combination of monomers, oligomers, etc., is not practical because of very slow rates of polymerization. Improved rates can be induced by thermal energy, however, particularly in combination with free-radical promoting catalysts. Thermal energy or heat for this purpose has been supplied by conventional convection ovens and radiant heat from infrared sources to effect the desired rate of polymerization. However, for many applications and especially in the coating art, heat for curing purposes is no longer satisfactory because (1) it is still slow; (2) it cannot be used with heat-sensitive substrates; and (3) often use of a volatile solvent is necessary, which solvent becomes a potential air pollutant or costly to recycle.

To enhance the rate of polymerization of ethylenically unsaturated organic compounds by exposure to radiation such as ultraviolet radiation photoinitiators or photosensitizers are included with said organic compounds. Typical photosensitizers have been benzene sulfonyl chloride, p-toluene sulfonyl chloride, naphthalene sulfonyl chloride, zinc and cadmium sulfides, and sulfinic and phosphinic compounds. These prior art photoinitiators, however, have not been completely satisfactory, particularly in photopolymerizable compositions which contain pigments. For clarity, the term photopolymerizable composition refers to that composition which hardens (cures) upon exposure to radiation and which can be a vehicle or a binder for use in surface coatings such as paint, varnish, enamel, lacquer, stain or ink.

Typical sources for ultraviolet radiation include a number of commercial units such as electric arc lamps, plasma arc torch (see U.S. Pat. No. 3,364,387) and even lasers having a lasing output in the ultraviolet spectrum (see copending application of De Souza and Buhoveckey, Ser. No. 189,254). The subject matter of the aforementioned patent and patent application are incorporated herein by reference.

Advantages of the instant invention over prior proposals include especially economical and efficient utilization of U.V. energy, particularly that in wave lengths between about 3200 A. and 4000 A. to perform "cold" polymerization (curing) of the vehicle at very short exposure times with attendant suppression of losses due to volatilization of components of paint, suppression of discoloration or degradation of the resulting deposit (which can be generally considered a film) and avoidance of shrinkage and distortion (the preservation of dimensional stability) and suppression of degradation of the substrate to which the vehicle deposited is applied, particularly when such substrate is a plastic, or paper, or fabric.

SUMMARY OF THE INVENTION

In accordance with the present invention, there is provided a process for the photopolymerization of ethylenically unsaturated organic compounds, which comprises subjecting to a source of ultraviolet radiation having wave lengths from about 1800 to 4000 Angstroms a composition comprising a photopolymerizable ethylenically unsaturated compound, a pigment and a photoinitiator selected from halogenated polynuclear ketones. The pigment which can be organic or inorganic can be present up to about 50% by weight of the composition, whereas the halogenated polynuclear ketone should be present in amounts of about 0.5 to 10% by weight.

The halogenated polynuclear ketone can be represented by the formula:

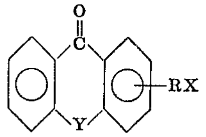

wherein Y represents a carbon, a carbonyl $\overset{O}{\overset{\|}{C}}$ sulfur, oxygen, a halosubstituted carbon; RX is a halogen-containing radical selected from halosulfonyl, α-haloalkyl and α-haloalkylated aryls. For the sulfonyl halide the chloro compound is preferred for efficiency and economy. There appears no particular advantage to having multiple chlorosulfonation and consequently the monochlorosulfonyl derivatives are also preferred.

Examples of such halogenated polynuclear ketones are: α - bromomethyl-anthroquinone, 1-chloro-2-bromomethyl anthroquinone, α - bromoethylanthroquinone, anthroquinone sulfonyl chloride, 10-bromoanthrone, α-halomethyl thioxanthones and α-halomethylxanthones. The basic ketones are commercially available and their halogenated versions can be prepared conveniently by known methods such as chlorosulfonation, haloalkylation and halogenation techniques.

The needed proportion of instant halogenated polynuclear ketone sensitizer also can be incorporated directly into the vehicle as a unit of a further polymerizable monomer, oligomer, prepolymer, or polymer vehicle. In such instance, for example, the sensitizer compound has a reactable functional group on it such as a carboxyl group or a hydroxyl group. Thus each sensitizer compound can be made to react with a further polymerizable material, e.g., glycidyl acrylate, either in monomeric form or already part of a preformed prepolymer or oligomer.

Typically the vehicles can constitute the entire deposit or a binder for solids to yield a cured product in the nature of a paint, varnish, enamel, lacquer, satin or ink. Usually the vehicles are fluid at ordinary temperature operation (between about 30° F. and about 300° F. and advantageously between ordinary room temperature and about 180° F.), and when polymerized by the U.V. radiation, give a tack-free film or deposit that is durable for ordinary handling. In the cured state such vehicle is resinous or polymeric in nature, usually cross-linked. Uncured for application to a substrate or uncured on such substrate, such vehicle consists essentially of a monomer or mixture of monomers, or a further polymerizable oligomer, prepolymer, resin, or mixture of same, or a resinous material dispersed or dissolved in a solvent that is copolymerizable therewith. Such solvent ordinarily is monomeric, but can be an oligomer (i.e., up to 4 monomer units connected) or prepolymer (mol weight rarely above about 2000). Oligomers and prepolymers should be understood herein as being polymeric in nature.

Suitable ethylenically unsaturated compounds which are photopolymerizable with the aid of the above photoinitiators include the various vehicles or binders which can be reactive vinyl monomers such as the lower alkyl esters of acrylic and methacrylic acids or polymer and prepolymers. Vinyl monomers particularly adapted for photopolymerization include methylmethacrylate, ethylmethacrylate, 2-ethylhexyl methacrylate, butylacrylate, isobutyl methacrylate, the corresponding hydroxy acrylates; e.g., hydroxy ethylacrylate, hydroxy propyl acrylate, hydroxy ethylhexyl acrylate, also the glycol acrylates; e.g., ethylene glycol dimethacrylate, hexamethylene glycol dimethacrylate, hexamethylene glycol dimethacrylate, the allyl acrylates, e.g., allyl methacrylate, diallyl methacrylate, the epoxy acrylates; e.g., glycidyl methacrylate; and the aminoplast acrylates; e.g., melamine acrylate. Others such as vinyl acetate, vinyl and vinylidene halides and amides, e.g., methacrylamide, acrylamide, diacetone acrylamide, butadiene, styrene, vinyl toluene, and so forth are also included.

Not only is the speed of U.V. curing quite good using the present sensitizers, but also the depth of cure is quite practical so that the resultant polymerized deposit resists scratching or disruption when first ostensibly "dry" on the surface. Curing can continue on stored pieces. Typical film thickness for the deposit can be about 0.1 to as high as 10 mils. Preferred cured deposits are continuous films, but decorative or message-transmitting ones need not be.

Typically the substrate workpieces coated with the uncured deposit or deposits are passed under a U.V.-providing light beam by a conveyor moving at pre-determined speeds. The substrate being coated can be metal, mineral glass, wood, paper, plastic, fabric, ceramic, etc.

A distinct advantage of the present invention is that many useful pigments can be incorporated, in modest proportions, into the vehicle without much deleterious effects. Thus, opacifying pigments such as zinc oxide can be used quite well. Titania, e.g., anatase and particularly rutile, can also be used with ease even though it makes for a much more difficult film to cure by U.V. radiation. Other filler materials and coloring pigments such as basic lead sulfate, magnesium silicate, silica, clays, wollastonite, talcs, mica, chromates, iron pigments, wood flour, Microballoons, hard polymer particles, and even reinforcing glass fiber or flake also are suitable in the vehicle to make a paint. Generally little to no pigments are used in photopolymerizable vehicles because of the attendant difficulty of rapid curing. Pigment particles tend to absorb the bulk of the useful ultraviolet radiation and leaving only a minor portion of said radiation to energize the sensitizers and generate the requisite amount of necessary free radicals.

The following examples show ways in which this invention has been practiced, but should not be construed as limiting it. Unless otherwise specifically stated herein, all parts by weight, all percentages are weight percentages, and all temperatures are in degrees Fahrenheit. Where the binder being cured is of the type normally curable by free-radical polymerization, it is sometimes advantageous for completeness of cure and speed to maintain a substantially inert atmosphere above the irradiated workpiece. Generally this is effected by maintaining a purge of nitrogen or other inert gas or placing a thin film of completely transparent polyethylene over the workpiece.

EXAMPLE 1

A number of acrylic resins and combinations thereof were utilized in evaluating the photoinitiator of the present invention. For convenience, the polymerizable binder composition comprised three arcylic resins in equal proportions. These resins were acrylic monomers, diacrylate and triacrylate oligomers.

A polymerizable composition consisting of ⅓ 2-ethylhexyl acrylate, ⅓ ethylene glycol diacrylate, and ⅓ trimethylpropane triacrylate was prepared with various photo-initiators in accordance with the present invention. To each composition was added conventional pigment and at various pigment-to-binder ratios ranging from .2 to .9 parts pigments per 1 part binder. The pigment was dispersed within the binder in a conventional manner.

Each sensitized binder composition was poured over a pair of steel panels and drawn down with a No. 8 wound wire rod to a film thickness or coating of approximately 0.05 mil. The coated but wet panels were each exposed to a different source of ultraviolet light; one provided from a plasma arc radiation source (PARS) and the other a conventional ultraviolet light supplied by Ash Dee Corporation, said light having two 4,000 watt mercury lamps. Exposure times were from 0.07 sec. to 30 secs., with the panels being placed approximately 5 inches from the ultraviolet source. These exposure times are calculated from the speed of the conveyor belt on which the panels are placed. For example, a speed rate of 300 feet per minute corresponds to 0.07 second exposure time, whereas the speed of approximately 86 to 100 feet per minute corresponds to 0.2 seconds. The photopolymerization was done in an inert atmosphere as described earlier.

In Table I following there are shown the results of exposing panels coated with various combinations of pigment to binder ratios and which also included prior art photoinitiators and those of the present invention. Under the column designated "cure," the nature of the finished or cured films is described. For example, tacky indicates that the film is still soft to the touch; i.e., incomplete polymerization. The term, hard, on the other hand indicates full cure.

TABLE I

| Photoinitiator, percent wt. | Pigment and pigment-to-binder ratio | U.V. source | Time, sec. | Cure |
|---|---|---|---|---|
| 1-chloromethyl naphthalene, 2% | Rutile $TiO_2$ (0.5) | PARS | 0.2 | Tacky and wet. |
| Do | do | Conventional | 7 | Do. |
| Bromomethylanthraquinone, 2% | do | PARS | 0.2 | Hard. |
| Do | do | Conventional | 7 | Do. |
| Do | Black $Fe_2O_3$ (0.5) | PARS | 0.2 | Do. |
| Do | Copper phthalocyanine greens. | PARS | 0.2 | Do. |
| Anthraquinone sulfonyl chloride, 2% | Rutile $TiO_2$ (0.7) | PARS | 0.2 | Do. |
| Do | Rutile $TiO_2$ (0.9) | PARS | 0.2 | Do. |
| Do | Anatase $TiO_2$ (0.8) | PARS | 0.2 | Do. |
| Anthraquininone sulfonyl chloride, 1% | Anatase $TiO_2$ (0.5) | LARS | 0.2 | Do. |
| 10-bromoanthrone, 2% | do | PARS | 0.2 | Do. |
| Chloromethylthioxanthrone, 2% | Rutile $TiO_2$ (0.8) | PARS | 0.2 | Do. |
| Do | ZnO (1.0) | PARS | 0.2 | Do. |
| Bromomethylxanthone, 2% | Rutile $TiO_2$ (0.5) | PARS | 0.2 | Do. |

EXAMPLE 2

A "clear" vehicle is prepared first from ⅓ part pentaerythritol triacrylate, ⅓ part hydroxyethyl acrylate, and ⅓ the adduct formed by reacting one mol of toluenediisocyanate with 2 mols of hydroxyethyl acrylate. Anatase $TiO_2$ is incorporated into said clear vehicle to provide a pigment to vehicle (binder) ratio of 0.6.

The curing procedure is carried out in the same manner described in Example 1. Without the incorporation of any sensitizers no curing (hardening) of the coated film (0.5 mil) is observed even with repeated exposures to the U.V. source. (Panels coated with the pigmented vehicle to about 0.5 mil thickness are passed under the PARS U.V. radiation source at line speeds of 100 feet per minute for 100 consecutive times without any observable curing.)

Anthraquinone sulfonyl chloride is incorporated into the pigmented vehicle to the extent of 2% and the panels coated with the sensitized vehicle are irradiated by the PARS ultraviolet source described in Example 1 at line speeds of 100 feet per minute showing full cure. With conventional ultraviolet the time was 7 sec.

Other pigments are incorporated such as zinc oxide, iron black, copper phthalocyanine blues and greens all resulting in the same hard cure after comparable exposure times.

EXAMPLE 3

A "clear" vehicle is prepared from ½ tri-methylolpropane and ½ 2-ethylacrylate. Into said vehicle is incorporated separately (with pigment to vehicle ratio of 0.5) a series of pigments, i.e., rutile $TiO_2$, anatase $TiO_2$, iron black, antimony oxide, lead basic sulfate, copper phthalocyanine greens. Into each sample is incorporated 2% by weight of p-toluene sulfonyl chloride. The samples are reduced to films (0.4 mil) on aluminum panels and irradiated with the PARS U.V. source at line speed of 100 feet per minute. No observable cure is shown even after repeated exposures. Into identical portions of the pigmented vehicles is incorporated 2% by weight of anthraquinone sulfonyl chloride. Full cure is shown after one exposure (0.2 sec.). The effectiveness of the photoinitiator is comparable for all the pigmented vehicles.

EXAMPLE 4

Repeating the same procedure of Example 3 except 2,6-dichlorosulfonyl anthraquinone is utilized. The same excellent results are obtained.

EXAMPLE 5

Repeating the same procedure of Example 3 except 1-chlorobromomethyl anthraquinone is utilized as the photoinitiator. Again the same excellent results are obtained.

EXAMPLE 6

Repeating the same procedure of Example 3 except bromoethylxanthone is incorporated. The same excellent results are obtained.

EXAMPLE 7

Repeating the same procedure of Example 3 except chloromethylthioxanthone is incorporated as the photoinitiator. Excellent cure is obtained.

EXAMPLE 8

Repeating the same procedure of Example 3 except the pigment-to-vehicle ratio is increased to 0.8. No observable change in the rate of curing is shown.

EXAMPLE 9

The pigmented vehicles of Example 3 containing the anthraquinone sulfonyl chloride as the photoinitiator are applied to cardboard and paper substrates in about 0.3 mil thickness. The curing procedure is carried out in the same manner with full cure shown at line speed of 100 and 200 feet per minute.

What is claimed is:

1. A pigmented vehicle photopolymerizable on exposure to ultraviolet radiation, comprising an ethylenically unsaturated organic compound, a pigment and a photoinitiator selected from the group consisting of chlorosulfonated polynuclear ketones and α-haloalkylated polynuclear ketones, said pigment comprising from 20 to 50% by weight of said vehicle and said photoinitiator being in the range of 0.5 to 10% by weight of said vehicle.

2. The pigmented vehicle of Claim 1 wherein said photoinitiator is selected from α-bromomethylanthroquinone, 1-chloro-2-α-bromomethylanthroquinone.

3. The pigmented vehicle of Claim 1 wherein said photoinitiator is anthraquinone sulfonyl chloride.

4. The pigmented vehicle of Claim 1 wherein said photoinitiator is 10-bromoanthrone.

5. The pigmented vehicle of Claim 1 wherein said photoinitiator is selected from *a*-haloalkyl thioxanthones and α-haloalkylxanthones.

6. The pigmented vehicle of Claim 1 wherein said pigment is an opacifying pigment.

7. The pigmented vehicle of Claim 1 wherein said photoinitiator is represented by the formula:

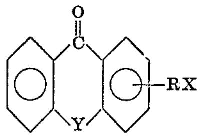

wherein Y is carbon, carbonyl $\overset{\mathrm{O}}{\overset{\|}{\mathrm{C}}}$ sulfur, oxygen and halosubstituted carbon, RX is a halogen containing radical selected from chlorosulfonyl, α-haloalkyl and α-haloalkylated aryls.

8. The pigmented vehicle of Claim 6 wherein the pigment is selected from organic and inorganic pigments.

References Cited

UNITED STATES PATENTS

| | | | |
|---|---|---|---|
| 3,702,812 | 11/1972 | McGinniss | 204—159.24 |
| 2,579,095 | 12/1951 | Sachs et al. | 204—159.24 |
| 3,113,024 | 12/1963 | Sprague et al. | 96—85 |

OTHER REFERENCES

Organic Chemistry of Sulfur, Suter, J. Wiley & Sons, chapter V.

MURRAY TILLMAN, Primary Examiner

R. B. TURER, Assistant Examiner

U.S. Cl. X.R.

96—115 P; 117—93.31, 142 R, 137 R, 138.8 R, 143 A; 204—159.14, 159.16, 159.18, 159.24; 260—2.5 B, 39 P, 39 M, 39 SB, 41 A, 41 B, 41 C, 41 AG, 77.5 LR, 80.75, 80.81, 86.1 E, 851, 856